(12) United States Patent
Rolfson

(10) Patent No.: US 6,599,666 B2
(45) Date of Patent: Jul. 29, 2003

(54) MULTI-LAYER, ATTENUATED PHASE-SHIFTING MASK

(75) Inventor: J. Brett Rolfson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 37 days.

(21) Appl. No.: 09/809,720

(22) Filed: Mar. 15, 2001

(65) Prior Publication Data

US 2002/0132173 A1 Sep. 19, 2002

(51) Int. Cl.[7] ............................................ G03F 9/00
(52) U.S. Cl. ............................................................ 430/5
(58) Field of Search ........................... 430/5, 322, 323, 430/324, 394

(56) References Cited

U.S. PATENT DOCUMENTS

| | | | |
|---|---|---|---|
| 5,605,776 A | 2/1997 | Isao et al. | 430/5 |
| 5,667,919 A | 9/1997 | Tu et al. | 430/5 |
| 5,783,337 A | 7/1998 | Tzu et al. | 430/5 |
| 5,795,682 A | 8/1998 | Garza | 430/5 |
| 5,897,979 A | 4/1999 | Tzu et al. | 430/5 |
| 5,906,910 A * | 5/1999 | Nguyen et al. | 430/5 |
| 5,928,813 A | 7/1999 | Krivokapic et al. | 430/5 |
| 5,935,736 A | 8/1999 | Tzu | 430/5 |
| 5,939,227 A | 8/1999 | Smith | 430/5 |
| 6,120,942 A * | 9/2000 | Reinberg | 430/5 |
| 6,423,455 B1 * | 7/2002 | Tzu | 430/5 |
| 6,436,587 B1 * | 8/2002 | Ulrich et al. | 430/5 |

* cited by examiner

Primary Examiner—S. Rosasco
(74) Attorney, Agent, or Firm—TraskBritt

(57) ABSTRACT

The present invention provides an attenuated phase shift mask ("APSM") that, in each embodiment, includes completely transmissive regions sized and shaped to define desired semiconductor device features, slightly attenuated regions at the edges of the completely transmissive regions corresponding to isolated device features, highly attenuated regions at the edges of completely transmissive regions corresponding to closely-spaced or nested device features, and completely opaque areas where it is desirable to block transmission of all radiation through the APSM. The present invention further provides methods for fabricating the APSMs according to the present invention.

21 Claims, 11 Drawing Sheets

MULTI-LAYER, ATTENUATED PHASE-SHIFTING MASK

BACKGROUND OF THE INVENTION

1. Field of the Invention

The present invention relates to photolithography techniques used in semiconductor device manufacturing processes. Specifically, the present invention relates to a multi-layer, attenuated phase-shifting mask or reticle that reduces problems associated with side lobe printing in areas including closely-spaced or nested features, while maximizing resolution and depth-of-focus performance for isolated features of a semiconductor device.

2. State of the Art

Photolithography processes are essential to the fabrication of state of the art semiconductor die. Such processes are used to define various semiconductor die features included in semiconductor dice and generally include exposing regions of a resist layer to patterned radiation corresponding to the semiconductor die circuit feature to be defined in a substrate underlying the layer of resist. After exposure, the resist layer is developed to selectively reveal areas of the substrate that will be etched to define the various device features while selectively protecting those areas of the substrate which are not to be exposed to the etching process. In order to properly form a radiation pattern over a resist layer, the radiation is generally passed through a reticle or mask which projects the semiconductor die feature pattern to be formed in the resist layer.

Various types of photolithographic masks are known in the art. For example, known masks often include a transparent plate covered with regions of a radiation blocking material, such as chromium, which define the semiconductor die feature pattern projected by the mask. Such masks are called binary masks since radiation is completely blocked by the radiation blocking material and fully transmitted through the transparent plate in areas not covered by the radiation blocking material. However, binary masks cause significant fabrication problems, particularly where semiconductor die dimensions shrink below 1 µm.

As the pattern features of a binary mask are defined by boundaries between opaque, radiation blocking material and material which is completely radiation transmissive, radiation passing through a binary mask at the edge of a pattern feature will be diffracted beyond the intended image boundary and into the intended dark regions. Such diffracted radiation prevents formation of a precise image at the feature edge, resulting in semiconductor die features which deviate in shape or size from the intended design. Because the intensity of the diffracted radiation drops off quickly over a fraction of a micron, diffraction effects are not particularly problematic where semiconductor die have dimensions on the order of 1 µm. However, as feature dimensions of state of the art semiconductor die shrink well below 0.5 µm, the diffraction effects of binary masks become terribly problematic.

Another type of mask known in the art is an attenuated phase shift mask (APSM). APSM's were developed to address the diffraction problems produced by binary masks and are distinguished from binary masks in that, instead of completely blocking the passage of radiation, the less transmissive regions of the mask are actually partially transmissive. A Importantly, the attenuated radiation passing through the partially transmissive regions of an APSM generally lacks the energy to substantially affect a resist layer exposed by the mask. Moreover, the partially transmissive regions of ASPMs are designed to shift the passing radiation 180° relative to the radiation passing through the completely transmissive regions and, as a consequence, the radiation passing through the partially transmissive regions destructively interferes with radiation diffracting out from the edges of the completely transmissive regions. Thus, the phase shift greatly reduces the detrimental effects of diffraction at the feature edges, thereby increasing the resolution with which sub-micron features may be patterned on a resist layer.

A conventional APSM 4 is illustrated in drawing FIG. 1. As can be seen, the APSM 4 includes a transparent substrate 6 coated with a partially transmissive material 7 (to ease description, drawing FIG. 1 provides a greatly simplified APSM). The partially transmissive material 7 has been patterned to form a completely transmissive region 8 and two attenuated regions 10a, 10b. The attenuated regions 10a, 10b of a typical APSM 4 are typically designed to allow the passage of between about 4% (low transmission) and 20% (high transmission) of the incident radiation 12. The partially transmissive material 7 forming the attenuated regions 10a, 10b is formed to a thickness that shifts the incident radiation 12 one hundred eighty degrees (180°) out of phase.

Also provided in drawing FIG. 1 is a graph 16 illustrating the electromagnetic intensity (plotted on the vertical axis) of the radiation passing through the APSM 4 relative to the position (plotted on the horizontal axis) on the surface of the exposed resist. As shown, the intensity curve 18 includes a first component 20 located primarily between the edges 22a, 22b formed between the attenuated regions 10a, 10b and the completely transmissive region 8 of the APSM 4. The first component 20 of the intensity curve 18 corresponds to the electromagnetic intensity of the radiation passing through the completely transmissive region 8 of the APSM 4 illustrated in drawing FIG. 1. As can be seen in the graph 16, the electromagnetic intensity of the radiation falls to zero at points 24a, 24b, which are near the edges 22a, 22b. Points 24a, 24b correspond to the locations where the magnitudes of the in phase radiation passing through the completely transmissive region 8 and the out of phase radiation passing through the attenuated regions 10a, 10b are equal. Beyond points 24a, 24b and moving away from the edges 22a, 22b, the electromagnetic intensity of the transmitted radiation grows again to a steady value as indicated by the second curve components 26a, 26b. The second curve components 26a, 26b represent the electromagnetic intensity of the radiation passing through the attenuated regions 10a, 10b of the APSM 4.

The electromagnetic intensity represented by the second curve components 26a, 26b is also known as "ringing effects," and one significant disadvantage of APSMs is that such ringing effects become much more severe as feature density of an APSM increases. As device features designed into an APSM are spaced closer and closer together, the ringing effects of adjacent device features begin to overlap, and as the ringing effects overlap, the electromagnetic intensity of such ringing effects becomes additive. These increased ringing effects are known as "additive side lobes", "additive ringing effects", or "proximity effects." In contrast to isolated ringing effects produced by isolated device features, the electromagnetic intensity of additive side lobes created by closely-spaced (i.e., 0.5 µm) or nested device features often becomes sufficiently intense to cause printing of the resist layer, which is commonly termed "side lobe printing."

Illustrated in drawing FIG. 2 is the additive ringing effects associated with conventional APSMs having closely-spaced feature formations. As illustrated in drawing FIG. 2, a second APSM 30 includes a transparent substrate 32 coated with a partially transmissive phase-shifting film 34 (again, for ease of description, drawing FIG. 2 provides a greatly simplified A APSM). The partially transmissive phase-shifting film 34 has been patterned to form four attenuating regions 36a–36d and three completely transmissive regions 38a–38c, which are closely-spaced. Radiation 39 incident on the APSM 30 passes through the completely transmissive regions 38a–38c and the attenuated regions 36a–36d and impinges upon the surface of the resist layer to be patterned (not illustrated in drawing FIG. 2).

Included in drawing FIG. 2 is a graph 40 illustrating the electromagnetic intensity of the radiation incident upon the surface of the resist layer to be patterned. The graph 40 includes an intensity curve 42 made up of various components, with the first components 43a–43c illustrating the electromagnetic intensity of the radiation passing through the completely transmissive regions 38a–38c of the APSM 30, the second components 44a, 44b illustrating the electromagnetic intensity of the ringing effects produced by the radiation passing through the isolated attenuated regions 36a, 36d, and the third components 46a, 46b illustrating the electromagnetic intensity of the additive side lobes produced by the dense feature arrangement formed by the closely-spaced attenuated regions 36b, 36c. As can be seen in drawing FIG. 2, the magnitude of the second components 44a, 44b (represented by line "$I_1$"), which illustrate the intensity of the ringing effects produced by isolated attenuated regions 36a, 36d, is significantly lower than that of the third components 46a, 46b (represented by line "$I_2$"), which illustrate the electromagnetic intensity of the additive side lobes.

Provided in drawing FIG. 3 is a cross-sectional view of a partially fabricated structure 50 after exposure through the APSM 30 illustrated in drawing FIG. 2. The partially fabricated structure 50 includes a semiconductor substrate 52 and a developed resist layer 54. The developed resist layer 54 exhibits a set of depressions 56a, 56b resulting from the relatively high electromagnetic intensity of the additive side lobes caused by the dense feature arrangement of the APSM 30. As device feature density increases, so will the intensity of the additive side lobes and the extent to which the resist layer is patterned due to exposure to additive ringing effects. Thus, depressions in the resist layer due to additive ringing effects may, in some situations, degrade the resist layer to such an extent that entire semiconductor dice become unusable due to damage incurred during a subsequent etch process.

As is well known in the art, the ringing intensity is inversely related to the attenuation of the partially transmissive material used in APSMs. Increasing the attenuation of the partially transmissive material will, therefore, decrease any resultant ringing effects, while decreasing the attenuation will increase any resultant ringing effects. Thus, the intensity of additive side lobes produced by closely formed features in an APSM may be decreased simply by increasing the attenuation of the partially transmissive regions included therein.

However, increasing the attenuation of the partially transmissive areas of APSMs also has significant drawbacks. For example, increasing the attenuation of the partially transmissive areas decreases print performance as well as the resolution and depth-of-focus achievable by the APSM. Reduction of depth-of-focus and resolution characteristics of an APSM are particularly problematic in the fabrication of state of the art semiconductor devices, which requires that an APSM accurately project images corresponding to sub-0.5 $\mu$m device features while focusing such images through relatively thick layers of resist. In addition, even with the most precise fabrication equipment, sub-micron deviations from the optimum focus position of the APSM relative to the resist layer to be patterned will occur, and decreasing the depth-of-focus of an APSM increases the probability that fabrication defects may result from such slight deviations. Therefore, increasing the attenuation of the partially transmissive materials included in state of the art APSMs requires a careful compromise between control of additive ringing effects and maximization of resolution and depth-of-focus performance.

Furthermore, state of the art semiconductor die often include closely-spaced or nested features as well as features which are isolated. It would, therefore, be an improvement in the art to provide an APSM that includes highly attenuated regions (i.e., attenuating regions allowing about 4% to about 10% transmittance of incident radiation) where necessary to control additive ringing but also includes slightly attenuated regions (i.e., attenuating regions allowing about 12% to about 20% transmittance of incident radiation) where isolated device features are to be formed. Such an APSM would enable control of additive ringing effects where needed without compromising resolution and depth-of-focus performance where additive ringing effects are of little or no concern.

SUMMARY OF THE INVENTION

The present invention addresses the foregoing needs by providing an APSM that, in each embodiment, includes completely transmissive regions sized and shaped to define desired device features, slightly attenuated regions at the edges of completely transmissive regions corresponding to isolated device features, highly attenuated regions at the edges of completely transmissive regions corresponding to closely-spaced or nested device features, and completely opaque areas where it is desirable to block transmission of all radiation through the APSM. The present invention further provides methods for fabricating the APSMs according to the present invention.

In one embodiment, the method of fabricating an APSM according to the present invention includes providing a transparent substrate. The transparent substrate is coated with a first attenuating layer that shifts the phase of transmitted radiation by 180° and is only slightly attenuated. The first attenuating layer is coated with a second attenuating layer that does not shift the phase of passing radiation, but further attenuates the intensity of any radiation passing therethrough. An opaque layer is then formed over the second attenuating layer. Using this intermediate structure, a desired APSM according to the present invention may be formed.

To form a desired APSM, the opaque layer is coated with a resist. The resist is then patterned to create a first patterned resist defining the semiconductor die feature pattern to be projected by the finished APSM. The opaque layer is then etched.

After the opaque layer is etched, the first patterned resist may be left in place and the second and first attenuating layers may be etched using the first patterned resist as a template. The first patterned resist is then stripped, leaving a first intermediate mask structure including completely transmissive regions corresponding to the pattern to be projected by the mask and completely opaque regions where the opaque layer and first and second attenuating layers remain intact. Alternatively, the first patterned resist may be removed after etching the opaque layer, and the opaque layer alone may be used as the template for etching the first and second attenuating layers.

A second layer of resist is deposited over the first intermediate mask structure. The second layer of resist is patterned to define a second patterned resist, which exposes areas of the intermediate mask structure wherein slightly attenuated regions will be formed. The opaque layer and the second attenuating layer in the areas exposed by the second patterned resist are then etched, revealing slightly attenuating regions formed from portions of the first attenuating layer. The second patterned resist is then stripped, and the resulting second intermediate mask structure includes completely transmissive regions sized and shaped in accordance with the device pattern to be projected by the mask, slightly attenuated regions, which shift passing radiation one hundred eighty degrees (180°), and opaque regions where the opaque layer, as well as the first and second attenuating layers, remain intact. Preferably, the slightly attenuated regions are provided at the edges of each of the completely transmissive regions corresponding to isolated device features, thereby maximizing image resolution and depth-of-focus performance where it is not necessary to increase attenuation to combat the negative effects produced by additive side lobes.

A third resist is deposited over the second intermediate mask structure. The third resist is then patterned to form a third patterned resist, which exposes areas of the second intermediate mask structure wherein highly attenuated regions will be formed. The areas exposed by the third patterned resist are then etched to remove only the opaque layer, thereby defining regions were incident radiation is phase shifted one hundred eighty degrees (180°) and highly attenuated as it passes through both the first and second attenuating layers. Preferably, such highly attenuated regions are formed at the edges of completely transmissive regions corresponding to closely-spaced or nested device features, thereby increasing the resolution of such semiconductor die features projected by the finished mask, while minimizing or eliminating any defects from additive ringing effects.

The third patterned resist is then stripped leaving a completed mask according to the present invention. The completed mask, therefore, includes completely transmissive regions corresponding to the pattern to be projected by the mask, slightly attenuated regions, which phase shift passing radiation one hundred eighty degrees (180°), highly attenuated regions, which also shift passing radiation 180°, and opaque regions where the opaque layer and first and second attenuating layers remain intact.

As can be appreciated, the method of the present invention is highly adaptable and can be used to fabricate APSMs having any desired feature pattern. Moreover, the steps of the method can be modified in several aspects while still obtaining a desired APSM. For example, etch stop techniques can be incorporated into the method of the present invention to eliminate one or more etching steps. However, in each of its embodiments, the method of the present invention advantageously produces APSMs including completely transmissive regions, slightly attenuated regions, and highly attenuated regions, and the size, shape, and position of these various regions can be modified or adjusted to produce any desirable semiconductor die feature pattern.

Other features and advantages of the present invention will become apparent to those of skill in the art through a consideration of the ensuing description, the accompanying drawings, and the appended claims.

BRIEF DESCRIPTION OF THE SEVERAL VIEWS OF THE DRAWINGS

The Figures presented in conjunction with this description are not actual views of any particular portion of a device or component, but are merely representations employed to more clearly and fully depict the present invention.

DETAILED DESCRIPTION OF THE INVENTION

Figure 1:
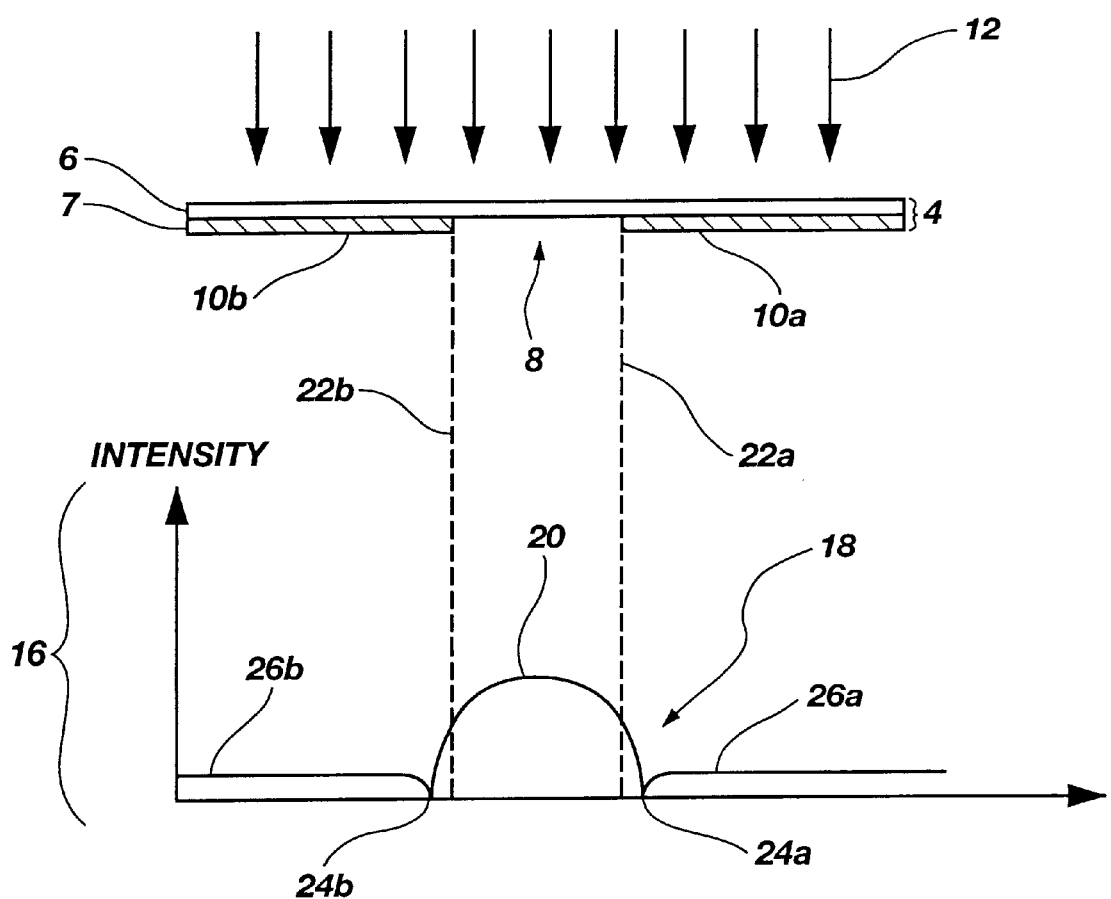
FIG. 1 provides a schematic illustration of a prior art APSM as well as a graph depicting the electromagnetic intensity of radiation projected through the prior art APSM.
Figure 2:
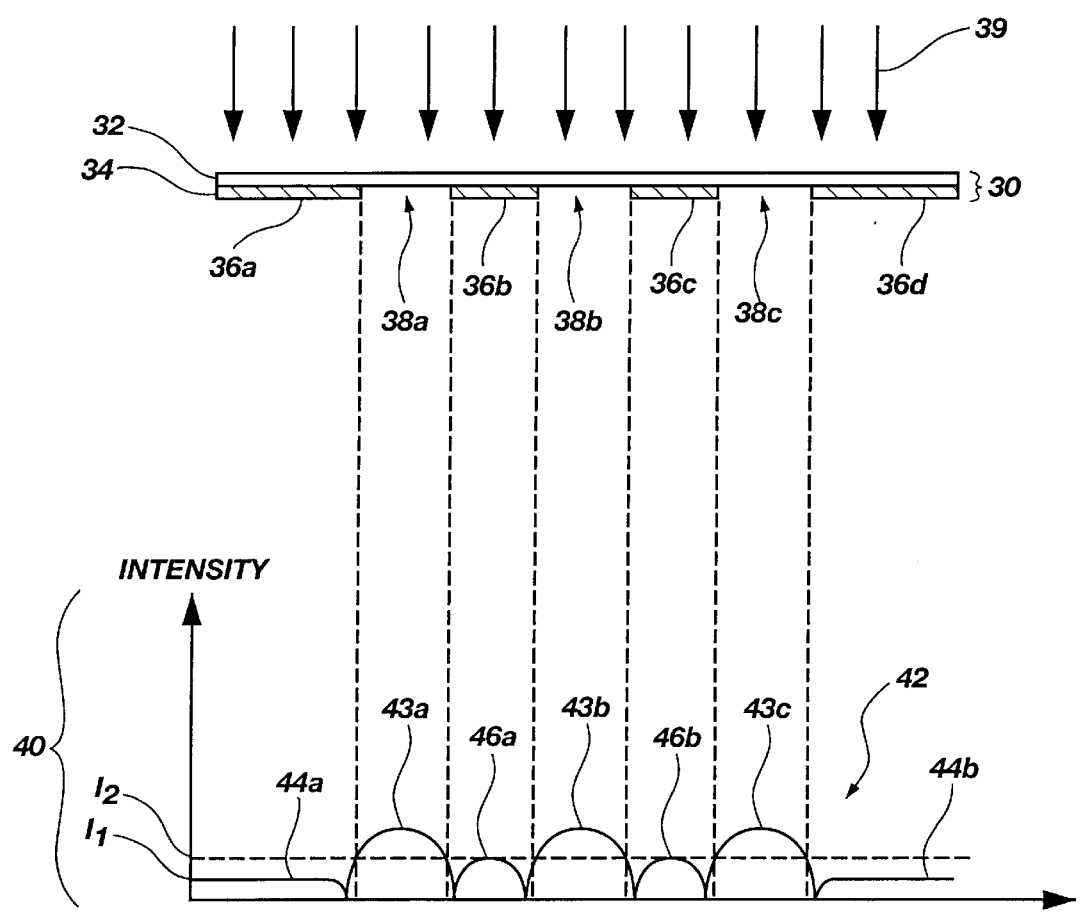
FIG. 2 provides a schematic illustration of a second prior art APSM as well as a graph depicting the electromagnetic intensity of radiation projected through the second prior art APSM.
Figure 3:
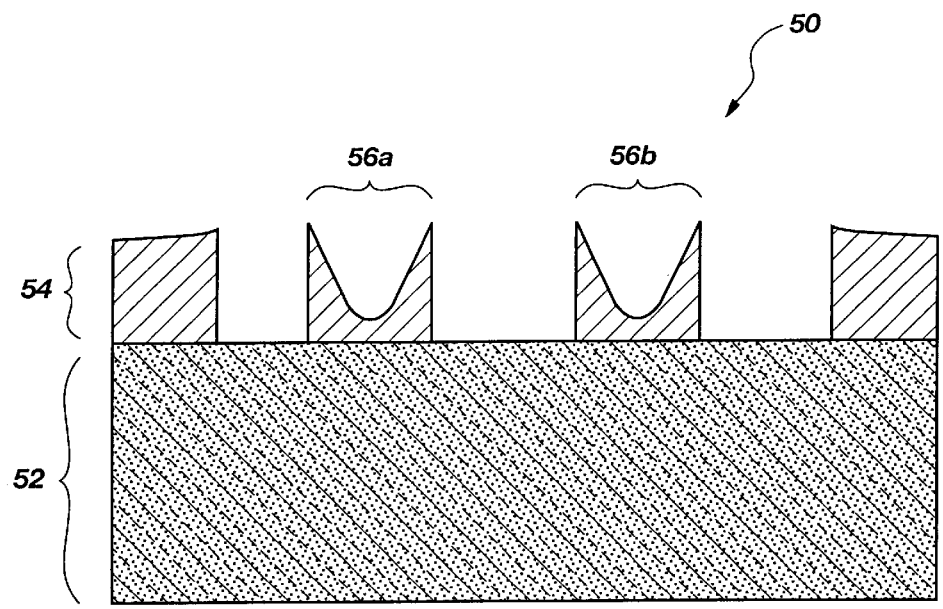
FIG. 3 schematically illustrates a cross-section of a partially fabricated semiconductor device structure after exposure through the second prior art APSM illustrated in FIG. 2.
Figure 4:
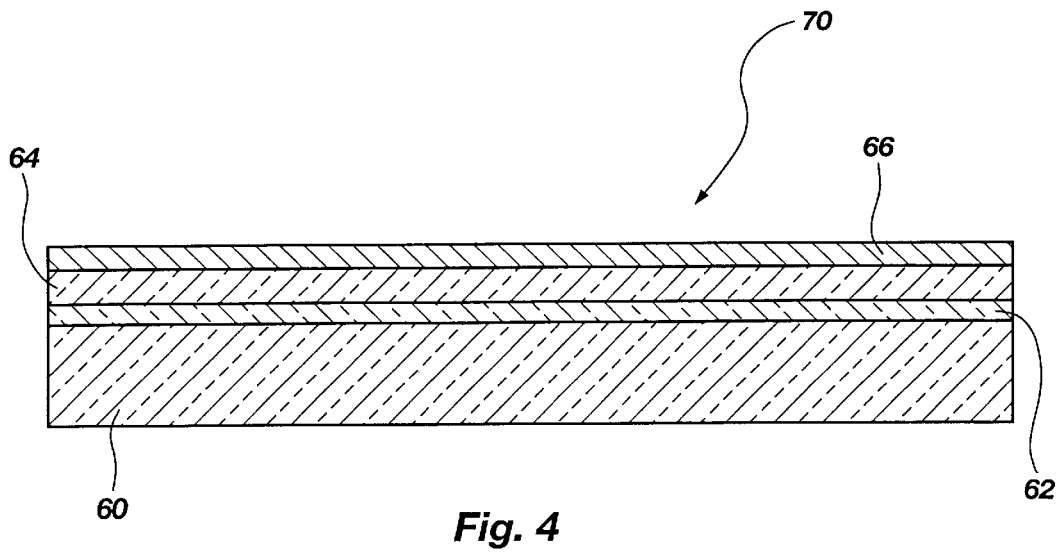
FIG. 4 schematically illustrates a cross-section of a first intermediate mask structure formed in the first embodiment of the method of the present invention.
Figure 11:
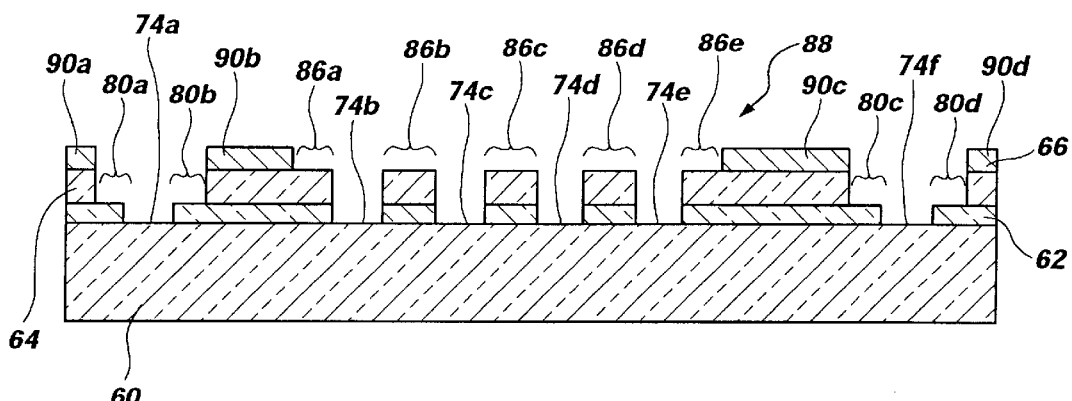
FIG. 11 schematically illustrates a first embodiment of the APSM of the present invention.

A first embodiment of the method of forming an APSM according to the present invention is schematically illustrated in drawing FIG. 4 through drawing FIG. 11. In each of these figures, the structures representing the various intermediate APSM structures, as well as the complete APSM, are greatly simplified for ease of description.

As is illustrated in drawing FIG. 4, the method of the present invention includes providing a transparent substrate 60, such as quartz, fused silica, or other type glass substrates, etc. The transparent substrate 60 is then coated with a first attenuating layer 62, such as a layer of chromium oxynitride ($CrO_xN_y$) or chromium fluoride ($CrF_x$). The first attenuating layer 62 is preferably highly transmissive (i.e., allows about 12%–20% transmission) and shifts the phase of any passing radiation by 180°. The first attenuating layer 62 is then coated with a second attenuating layer 64, such as a layer of molybdenum silicide oxynitride ($MoSiO_xN_y$). The second attenuating layer 64 is formed such that the second attenuating layer 64 does not shift the phase of passing radiation, but simply further attenuates the intensity of any passing radiation. Preferably, the total attenuation of radiation passing through the first attenuating layer 62 and the second attenuating layer 64 is about 90% to about 96%, allowing about 4% to about 10% transmission. An opaque layer 66, for example, a layer of chromium, is then formed over the second attenuating layer 64, resulting in a first intermediate mask structure 70 that may be used to form a desired mask according to the first embodiment of the APSM of the present invention.

Figure 5:
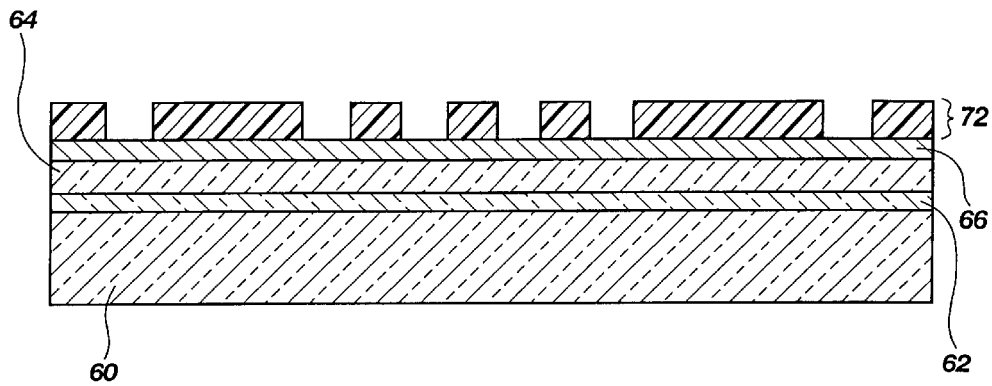
FIG. 5 schematically illustrates a first patterned resist formed over the first intermediate mask structure of FIG. 4.

As is illustrated in drawing FIG. 5, to form a desired APSM according to the first embodiment of the APSM of the present invention using the first intermediate mask structure 70, a first patterned resist 72 is formed over the opaque layer 66. The first patterned resist 72 is formed by first coating the opaque layer 66 with any suitable resist and patterning the resist by known methods to define a desired feature pattern to be projected by the completed mask. After formation of the first patterned resist 72, the opaque layer 66 is etched to reveal areas of the second attenuating layer 64. Any suitable etch process may be used to etch the opaque layer. For example, where the opaque layer includes chromium, a $Cl_2/O_2$ plasma etch process or a suitable wet etch process may be used to etch the opaque layer 66.

Figure 6:
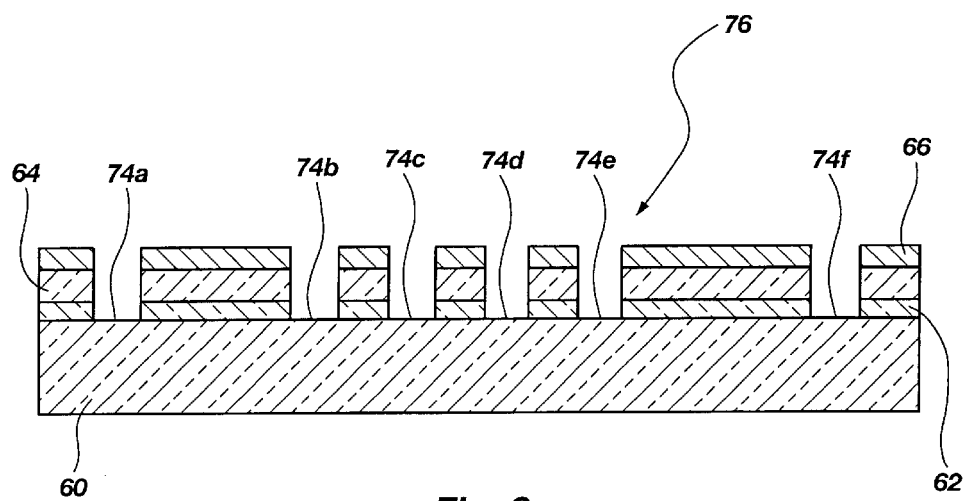
FIG. 6 provides a schematic illustration of a second intermediate mask structure formed in the first embodiment of the method of the present invention.

After the opaque layer 66 is etched, the first patterned resist 72 may be left in place. The second attenuating layer 64 and the first attenuating layer 62 may then be etched using the first patterned resist as a template, revealing the underlying transparent substrate and forming various completely transmissive regions 74a–74f (shown in drawing FIG. 6), which correspond in size, shape, and location to the device pattern to be projected by the completed APSM. The second attenuating layer 64 and first attenuating layer 62 are etched using any suitable method. However, where the second attenuating layer 64 includes $MoSiO_xN_y$, an $SF_6$ or $CF_4$ based plasma etch process is preferably used, and where the first attenuating layer 62 includes CrFx, the first attenuating layer 62 is preferably etched in a $Cl_2/O_2$ plasma. Moreover, where it is used as a template for the formation of the completely transmissive regions 74a–74f, the first patterned resist 72 is stripped after the completely transmissive regions 74a–74f are formed, leaving a second intermediate mask structure 76, which is illustrated in drawing FIG. 6, including completely transmissive regions 74a–74f.

Figure 7:
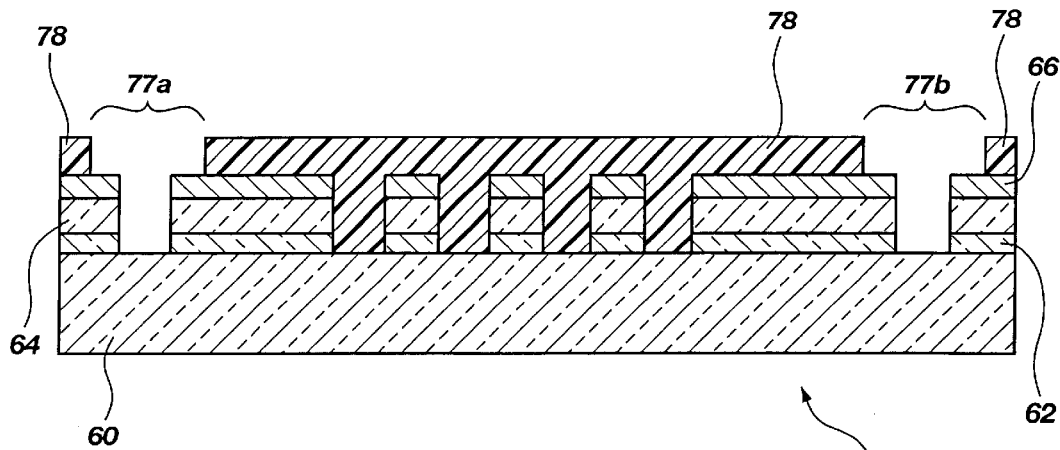
FIG. 7 schematically illustrates the intermediate mask structure depicted in FIG. 6, after a second patterned resist for creating slightly attenuated regions is formed thereover.

Once the second intermediate mask structure 76 is formed, slightly attenuated regions are formed where desired. Slightly attenuated regions are created using a second patterned resist 78 formed over the second intermediate mask structure 76, as shown in drawing FIG. 7. The second patterned resist 78 is formed by first coating the first intermediate mask structure 76 with any suitable resist and patterning the resist by known methods to create exposed areas 77a–77b on the second intermediate mask structure 76, wherein slightly attenuated regions are to be created.

Figure 8:
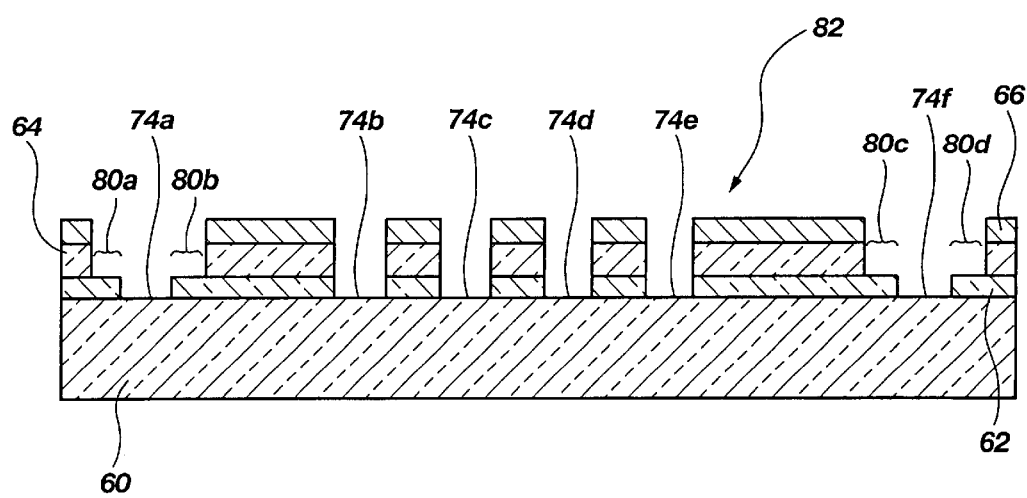
FIG. 8 provides a schematic illustration of a third intermediate mask structure formed in the first embodiment of the method of the present invention.

As is shown in drawing FIG. 8, which illustrates a third intermediate mask structure 82, the slightly attenuated regions 80a–80d are created by etching the opaque layer 66 and the second attenuating layer 64 in the exposed areas 77a–77b created by the second patterned resist 78. Again, the opaque layer 66 and the second attenuating layer 64 can each be etched by known etch processes, such as those already discussed. As can also be seen in drawing FIG. 8, the slightly attenuated regions 80a–80d are preferably formed at the edges of isolated completely transmissive regions 74a, 74f. Because the slightly attenuated regions 80a–80d are formed using portions of the first attenuating layer 62, which shifts transmitted radiation 1800, radiation transmitted through the slightly attenuated regions 80a–80d destructively interferes with radiation diffracting out from the edges of the isolated completely transmissive regions 74a, 74f, thereby greatly increasing the resolution with which the isolated completely transmissive regions 74a, 74f define desired device features. Moreover, because slightly attenuated regions 80a–80d allow transmission of about 12% to about 20% of the incident radiation, the slightly attenuated regions 80a–80d serve to maximize depth-of-focus performance.

Figure 9:
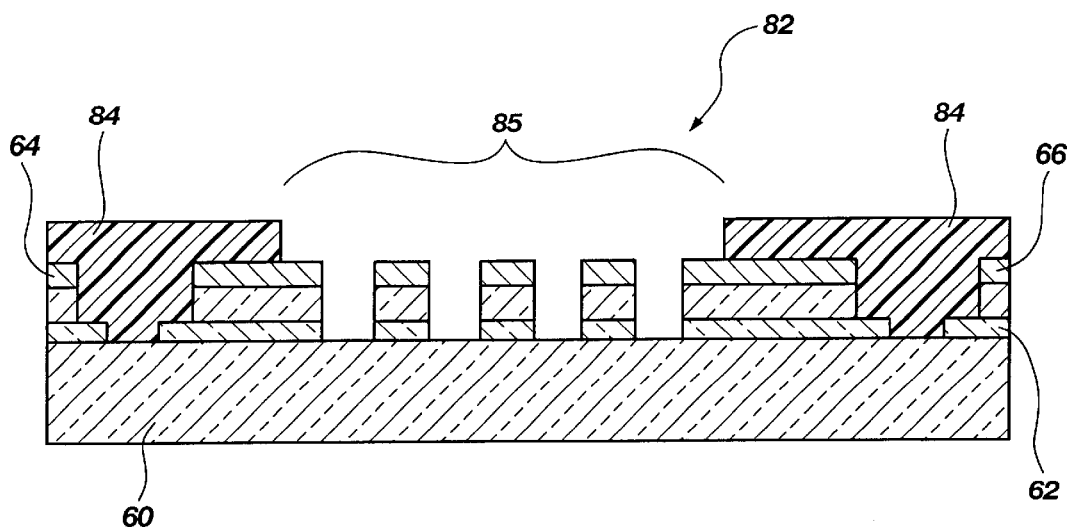
FIG. 9 and FIG. 10 schematically illustrate the third intermediate mask structure depicted in FIG. 8, after a third patterned resist for creating highly attenuated regions is formed thereover and the resulting structure is subjected to a selective etch process.

As shown in drawing FIG. 9, to create highly attenuated regions where desired, a third patterned resist 84 is formed over the third intermediate mask structure 82. The third patterned resist 84 is created by first coating the third intermediate mask structure 82 with a suitable resist. The resist is then patterned by known methods to expose an area 85 of the third intermediate mask structure 82 wherein highly attenuated regions are to be created.

Figure 10:
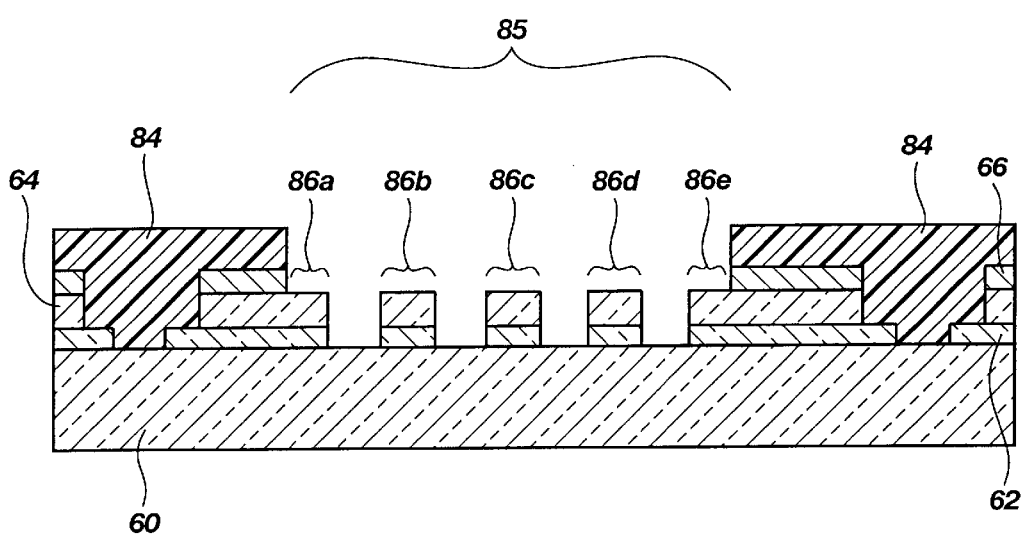

Highly attenuated regions 86a–86e are then formed by selectively etching the opaque layer 66 in the exposed area 85 (see drawing FIG. 10). The opaque layer 66 can be etched using any suitable etch process, such as the processes already discussed herein. After formation of the highly attenuated regions, the third patterned resist 84 is stripped, leaving a complete APSM 88 according to the first embodiment of the APSM of the present invention (shown in drawing FIG. 11). It is easily appreciated from reference to drawing FIG. 11 that the highly attenuated regions 86a–86e are preferably formed at the edges of closely-spaced transmissive regions 74b–74e which are closely-spaced. Because of the one hundred eighty degree (180°) phase shift provided by the first attenuating layer 62 and the high total attenuation provided by the highly attenuated regions 86a–86e, the highly attenuated regions 86a–86e formed at the edges of closely-spaced completely transmissive regions 74b–74e greatly increase the resolution with which the isolated completely transmissive regions 74a, 74f define desired device features, while minimizing or eliminating any fabrication defects that may otherwise occur due to additive ringing effects.

As can be appreciated by reference to drawing FIG. 11, even after formation of completely transmissive regions 74a–74f, slightly attenuated regions 80a–80d, and highly attenuated regions 86a–86e, portions of the opaque layer 66 remain, forming opaque regions 90a–90d. Opaque regions 90a–90d may be maintained on the finished APSM to prevent exposure to even attenuated radiation where attenuated radiation is not needed to increase image resolution. The first embodiment of the method of the present invention, therefore, provides an APSM having completely transmissive regions, highly attenuated regions, slightly attenuated regions, and opaque regions, which work in concert to maximize image resolution and depth-of-focus for isolated features, while minimizing or eliminating any defects caused by additive ringing effects in areas of high feature density and preventing any defects caused by transmission of attenuated radiation where attenuated radiation is not needed to enhance resolution and depth-of-focus.

Figure 12:
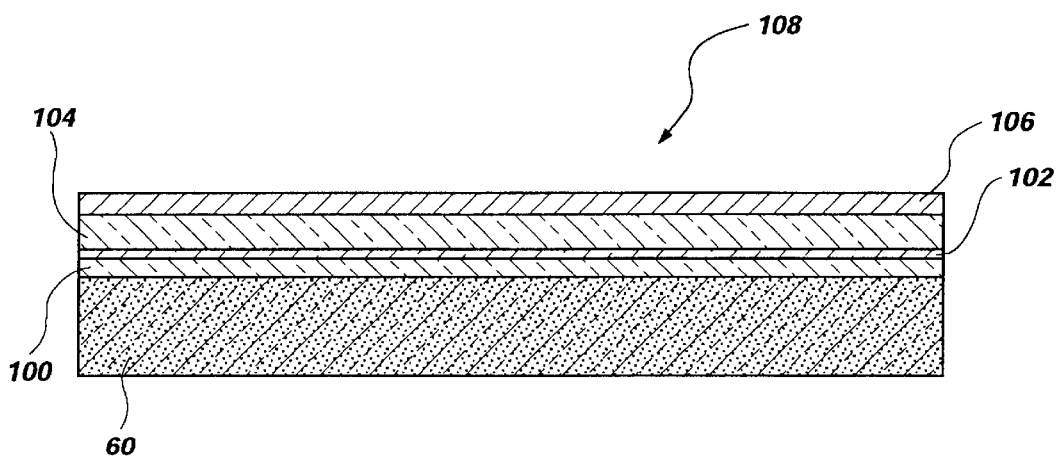
FIG. 12 schematically illustrates a cross-section of a first intermediate mask structure formed in the second embodiment of the method of the present invention.
Figure 19:
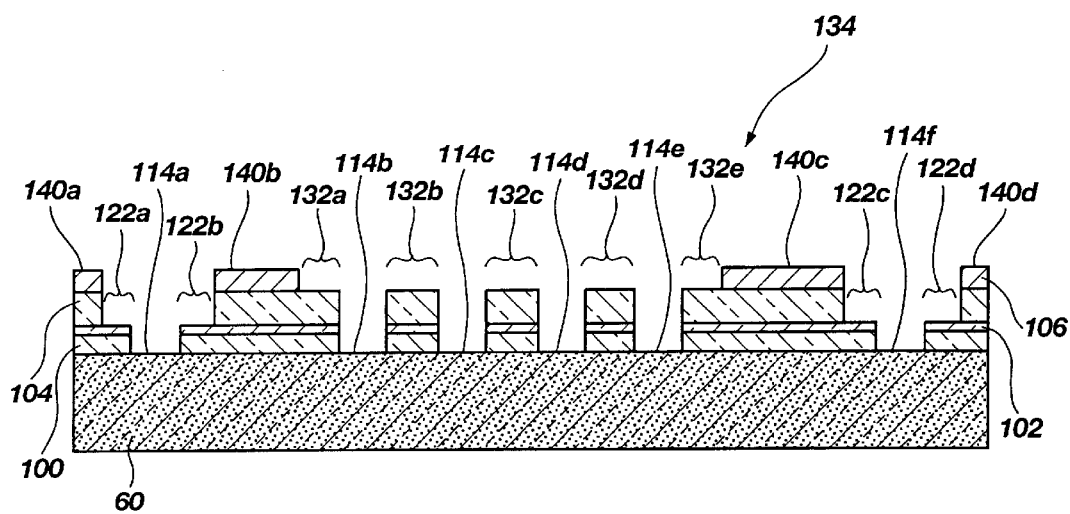
FIG. 19 schematically illustrates a second embodiment of the APSM of the present invention.

In a second embodiment, described in conjunction with drawing FIG. 12 through drawing FIG. 19, the method of the present invention involves the use of etch stop technology. As illustrated in drawing FIG. 12, the method of the second embodiment also involves providing a transparent substrate 60, which may also be, for example, a quartz, fused silica, or other glass substrate. A first attenuating layer 100 comprising $CrF_x$ is deposited over the transparent substrate, followed by the formation of an etch stop layer 102 over the first attenuating layer 100. The etch stop layer 102 may be formed of any suitable etch stop material that will allow for an etch selectivity between it and the etching chemistry utilized to etch the material adjacent to it (i.e., second attenuating layer 104 shown in FIG. 12). For example, the first etch stop layer 102 may be formed of silicon dioxide ($SiO2$).

The first attenuating layer 100 is only slightly attenuating, allowing about 12% to about 20% transmission. Moreover, the first attenuating layer 100 may be formed such that the first attenuating layer 100 induces a one hundred eighty degree (180°) phase shift in radiation passing through the first attenuating layer 100. Alternatively, the first etch stop layer 102 may be formed to induce a one hundred eighty degrees (180°) phase shift, while the first attenuating layer 100 serves only to attenuate passing radiation, or the first attenuating layer 100 and first etch stop layer 102 may be formed such that radiation must pass through both layers 100, 102 to be shifted one hundred eighty degrees (180°) out of phase. Where the first attenuating layer 100 is formed such that the first attenuating 100 layer both attenuates passing radiation and shifts the passing radiation one hundred eighty degree (180°) out of phase, the first etch stop layer 102 is formed to allow passage of radiation without inducing any further phase shifts.

As shown in drawing FIG. 12, a second attenuating layer 104 is formed over the etch stop layer 102. The second attenuating layer 104 is also preferably formed of $CrF_x$ and further attenuates passing radiation. The second attenuating layer 104 is preferably formed such that radiation passing through both the first attenuating layer 100 and the second attenuating layer 104 is highly attenuated (i.e., the combined attenuation of the first attenuating layer 100 and the second attenuating layer 104 is about 90% to about 96%, resulting in about 4% to about 10% transmittance). However, the second attenuating layer 104 does not induce any phase shift in radiation passing therethrough. Once a the second attenuating layer 104 is formed, an opaque layer 106 is provided over the second attenuating layer 104, resulting in a first intermediate mask structure 108. As is true in the first embodiment of the method of the present invention, the opaque layer 106 may be formed of any suitable material known in the art and by any suitable method, such as a deposited chromium layer.

Figure 13:
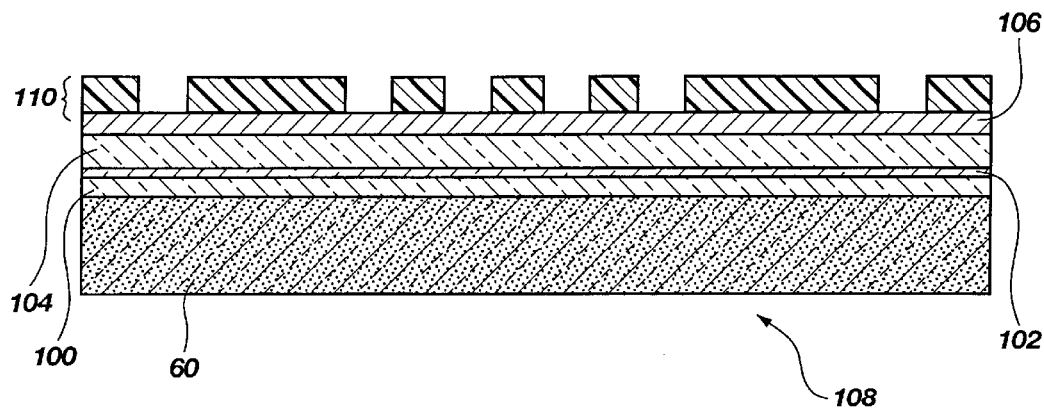
FIG. 13 schematically illustrates a first patterned resist formed over the first intermediate mask structure of FIG. 12.

Using the first intermediate mask structure 108, an APSM according to the second embodiment of the APSM of the present invention may be fabricated. Forming an APSM according to the second embodiment using the first intermediate mask structure 108 involves formation of a first patterned resist 110 over the opaque layer 106 of the first intermediate mask structure 108, as is shown in drawing FIG. 13. The first patterned resist 110 is created by first coating the opaque layer 106 with any suitable resist and patterning the resist by known methods to define the desired feature pattern to be projected by the completed APSM. After formation of the first patterned resist 110, the opaque layer 106 and the second attenuating A layer 104 are etched in a single step using a $Cl_2/O_2$ plasma etch process, which will stop at the etch stop layer 102. With the first patterned resist 110 still in place, the etch stop layer 102 is etched using a fluorine-based plasma etch process, and the first attenuating layer 100 is then etched using a second $Cl_2/O_2$ plasma etch process.

Figure 14:
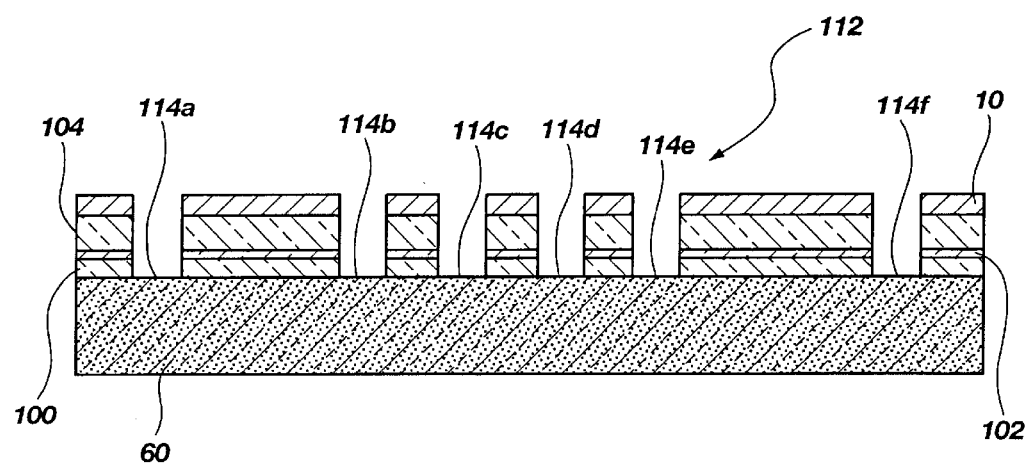
FIG. 14 provides a schematic illustration of a second intermediate mask structure formed in the second embodiment of the method of the present invention.

After etching the first attenuating layer 100, the first patterned resist 110 is stripped, leaving a second intermediate mask structure 112, as illustrated in drawing FIG. 14. The second intermediate mask structure 112 includes completely transmissive regions 114a–114f which correspond in size, shape and location to the device pattern to be projected by the mask.

Figure 15:
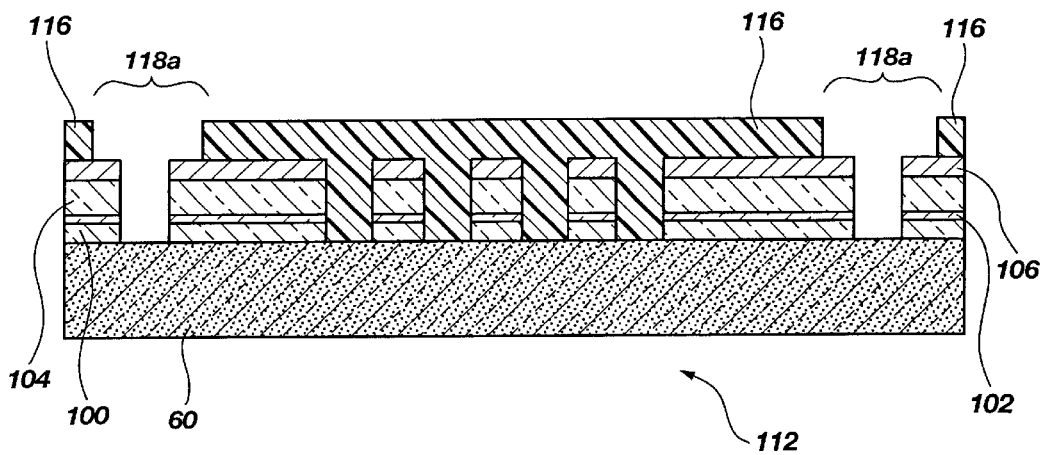
FIG. 15 schematically illustrates the intermediate mask structure depicted in FIG. 14, after a second patterned resist for creating slightly attenuated regions is formed thereover.

As can be seen in drawing FIG. 15, a second patterned resist 116 is then formed over the second intermediate mask structure 112, in order to form slightly attenuated regions where desired. The second patterned resist 116 is formed by first coating the second intermediate mask structure 112 with any suitable resist and patterning the resist by known methods to create exposed areas 118a, 118b of the second intermediate mask structure 112 wherein slightly attenuated regions are to be formed.

Figure 16:
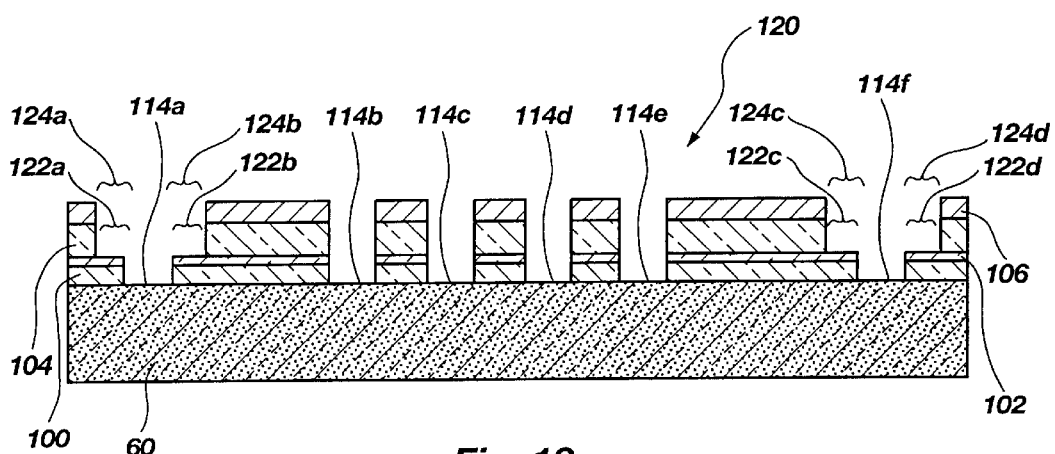
FIG. 16 provides a schematic illustration of a third intermediate mask structure formed in the second embodiment of the method of the present invention.

As can be appreciated by reference to drawing FIG. 16, which illustrates a third intermediate mask structure 120, the slightly attenuated regions 122a–122d are then created by etching the opaque layer 106 and the second attenuating layer 104 in a single step using a $Cl_2/O_2$ plasma etch process, which stops at the exposed portions 124a–124d of the etch stop layer 102, thereby reducing the number of etch steps necessary to form the slightly attenuated regions 122a–122d relative to the first embodiment of the method of the present invention.

Further illustrated in drawing FIG. 16 is that the slightly attenuated regions 122a–122d, are preferably formed only at the edges of isolated completely transmissive regions 114a, 114f. Because the slightly attenuated regions 122a–122d are formed of portions of the first attenuating layer 100 as well as portions of the etch stop layer 102, the slightly attenuating regions 122a–122d shift transmitted radiation one hundred eighty degrees (180°), and the radiation transmitted through the slightly attenuated regions 122a–122d destructively interferes with radiation diffracting out from the edges of the isolated completely transmissive regions 114a, 114f, thereby greatly increasing the resolution with which the isolated completely transmissive regions 114a, 114f define desired device features. Moreover, because slightly attenuated regions 122a–122d allow transmission of about 12% to about 20% of the incident radiation, the slightly attenuated regions 122a–122d serve to maximize depth-of-focus performance.

Figure 17:
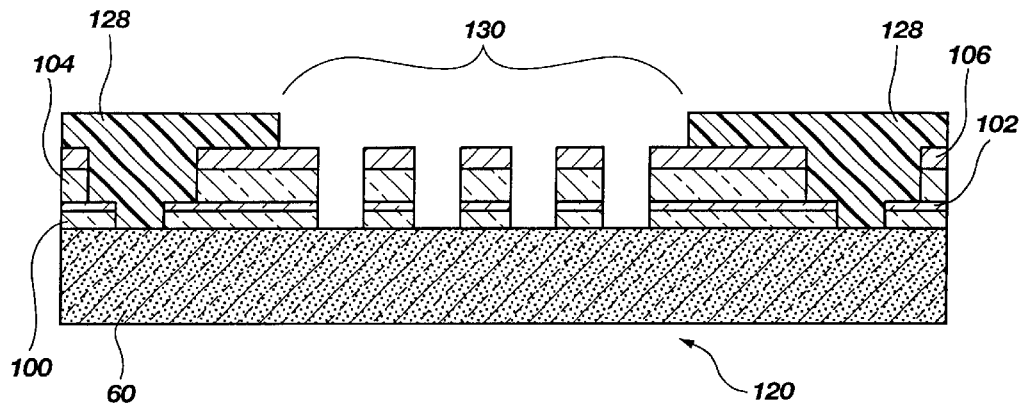
FIG. 17 and FIG. 18 schematically illustrate the third intermediate mask structure depicted in FIG. 16, after a third patterned resist for creating highly attenuated regions is formed thereover and the resulting structure is subjected to a selective etch process.

As illustrated in drawing FIG. 17, a third patterned resist 128 is formed over the third intermediate mask structure 120 to create highly attenuated regions where desired. The third patterned resist 128 is created by first coating the third intermediate mask structure 120 with any suitable resist. The resist is then patterned by known methods to expose an area 130 of the third intermediate mask structure 120 wherein highly attenuated regions are to be created.

Figure 18:
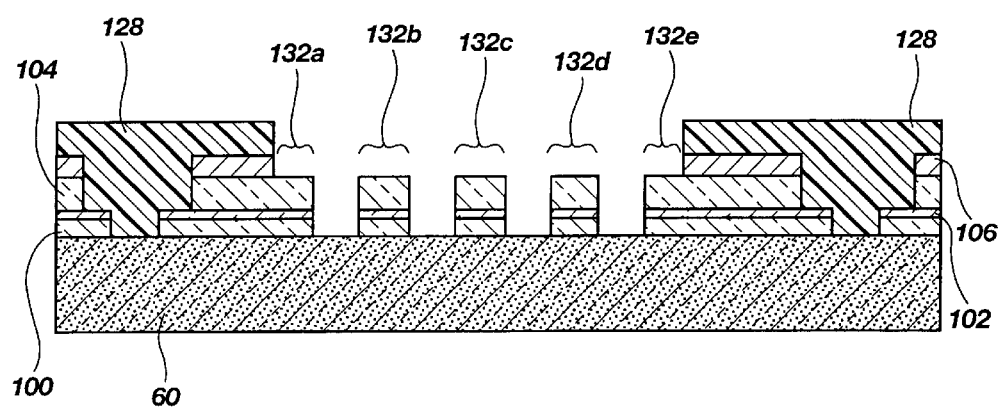

Highly attenuated regions 132a–132e are then formed by selectively etching the opaque layer 106 in the exposed area 130 (see drawing FIG. 18). Though the opaque layer 106 can be etched using any suitable etch process, where chromium is used as the opaque layer 106, for example, a $Cl_2/O_2$ plasma etch process or a suitable wet etch process may be used. After formation of the highly attenuated regions 132a–132e, the third patterned resist 128 is stripped, leaving a complete APSM 134 according to the second embodiment of the APSM of the present invention (shown in drawing FIG. 19).

As was true in the first embodiment of the APSM of the present invention, the highly attenuated regions 132a–132e included in the second embodiment of the APSM 134 of the present invention are preferably formed at the edges of the closely-spaced completely transmissive regions 114b–114e. The one hundred eighty degree (180°) phase shift provided by the first attenuating layer 100 and/or the etch stop layer 102 and the high total attenuation provided by the combined attenuations of the first attenuating layer 100 and the second attenuating layer 104, enhance the resolution of the images projected by the closely-spaced completely transmissive regions 114b–114e, while minimizing or eliminating any fabrication defects that may otherwise occur due to additive side lobes produced by the closely-spaced completely transmissive regions 114b–114e.

Reference to drawing FIG. 19 highlights that, even after formation of completely transmissive regions 114a–114f, slightly attenuated regions 122a–122d, and highly attenuated regions 132a–132e, portions of the opaque layer 106 remain, forming opaque regions 140a–140d. Again, opaque regions 140a–140d may be maintained on the finished APSM to prevent exposure to even attenuated radiation where attenuated radiation is not needed to increase image resolution. The second embodiment of the method of the present invention, therefore, also provides APSMs having completely transmissive regions, highly attenuated regions, slightly attenuated regions, and opaque regions, which work in concert to maximize image resolution and depth-of-focus for isolated features, while minimizing or eliminating any defects caused by additive ringing effects in areas of high feature density and preventing any defects caused by transmission of attenuated radiation where attenuated radiation is not needed to enhance resolution and depth-of-focus.

Though the method and APSM of the present invention have been described and illustrated herein with reference to two different embodiments, such descriptions and illustrations do not limit the scope of the present invention. The method of the present invention and design of an APSM according to the present invention are highly adaptable. For example, the method disclosed herein can be used to fabricate APSMs having any desired feature pattern. Moreover, the steps of the method and composition of the APSMs can be modified in several aspects while still obtaining an APSM according to the present invention. For instance, the method of the present invention may utilize etching processes different from those discussed herein. Additionally, materials different than those described herein, such as, different substrate materials, different attenuating materials, different light blocking materials, or different etch stop materials, may be used in conjunction with the method of the present invention to fabricate APSM according to the present invention having a different material composition than the APSMs according to the first and second embodiments. Therefore, the present invention is not to be defined or limited by the illustrative and descriptive examples provided herein, but, instead, the scope of the present invention is defined by the appended claims.

What is claimed is:

1. A method for fabricating an attenuated phase shift mask comprising:
   providing a substrate including:
      a first layer of attenuating material over said substrate;
      a second layer of attenuating material over said first layer of attenuating material; and
      an opaque layer of attenuating material;
   etching said substrate to form at least one completely transmissive region;
   etching said substrate to form at least one slightly attenuated region, said etching including forming a second patterned resist over said substrate; and
   etching said substrate to form at least one highly attenuated region.

2. The method according to claim 1, wherein etching said substrate to form said at least one completely transmissive region comprises forming a first patterned resist over said opaque layer of said substrate and etching said substrate to form a plurality of isolated completely transmissive regions and a plurality of closely-spaced completely transmissive regions.

3. The method according to claim 2, wherein etching said substrate to form said at least one slightly attenuated region comprises removing portions of said opaque layer and said second layer of attenuating material to form a plurality of slightly attenuated regions, each of said plurality of slightly attenuated regions being positioned at an edge defining one of said plurality of isolated completely transmissive regions.

4. The method according to claim 3, wherein etching said substrate to form said plurality of slightly attenuated regions comprises forming a second patterned resist over said substrate.

5. The method according to claim 2, wherein etching said substrate to form said at least one highly attenuated region comprises removing portions of said opaque layer to form a plurality of highly attenuated regions, each of said plurality of highly attenuated regions being positioned at an edge defining one of said plurality of closely-spaced completely transmissive regions.

6. The method according to claim 5, wherein etching said substrate to form said plurality of highly attenuated regions comprises forming a third patterned resist over said substrate.

7. The method according to claim 1, wherein providing said substrate further comprises providing said substrate comprising an etch stop layer between said first layer of attenuating material and said second layer of attenuating material.

8. The method according to claim 7, wherein etching said substrate to form said at least one completely transmissive region comprises forming a first patterned resist over said opaque layer of said substrate and etching said substrate to form a plurality of isolated completely transmissive regions and a plurality of closely-spaced completely transmissive regions.

9. The method according to claim 8, wherein etching said substrate to form said at least one slightly attenuated region comprises removing portions of said opaque layer and said second layer of attenuating material in a single etch step to form a plurality of slightly attenuated regions, each of said plurality of slightly attenuated regions being positioned at an edge defining one of said plurality of isolated completely transmissive regions.

10. The method according to claim 9, wherein etching said substrate to form said at least one highly attenuated region comprises removing portions of said opaque layer to form a plurality of highly attenuated regions, each of said plurality of highly attenuated regions being positioned at an edge defining one of said plurality of closely-spaced completely transmissive regions.

11. The method according to claim 10, wherein etching said substrate to form said plurality of highly attenuated regions comprises forming a third patterned resist over said substrate.

12. An attenuated phase shift mask comprising:
a transparent substrate;
a plurality of isolated completely transmissive regions;
a plurality of slightly attenuated regions, each of said plurality of slightly attenuated regions being formed at an edge defining one of said plurality of isolated completely transmissive regions;
a plurality of completely transmissive regions; and
a plurality of highly attenuated regions, each of said plurality of highly attenuated regions being formed at an edge defining one of said plurality of isolated completely transmissive regions, said plurality of highly attenuated regions comprising a first layer of attenuating material, a layer of etch stop material, and a second layer of attenuating material.

13. The attenuated phase shift mask of claim 12, further comprising a plurality of opaque regions.

14. The attenuated phase shift mask of claim 13, wherein said plurality of opaque regions comprise chromium.

15. The attenuated phase shift mask of claim 12, wherein said transparent substrate comprises a material selected from a group consisting of quartz, fused silica, and glass.

16. The attenuated phase shift mask of claim 12, wherein said plurality of slightly attenuated regions comprises a layer of attenuating material selected from a group consisting of chromium oxynitride and chromium fluoride.

17. The attenuated phase shift mask of claim 12, wherein said plurality of highly attenuated regions comprises a first layer of attenuating material and a second layer of attenuating material.

18. The attenuated phase shift mask of claim 17, wherein said first layer of attenuating material is selected from a group consisting of chromium oxynitride and chromium fluoride and said second layer of attenuating material comprises molybdenum silicide oxynitride.

19. The attenuated phase shift mask of claim 12, wherein said plurality of slightly attenuated regions comprises a layer of attenuating material and a layer of etch stop material.

20. The attenuated phase shift mask of claim 19, wherein said layer of attenuating material is selected from a group consisting of chromium oxynitride and chromium fluoride and said layer of etch stop material comprises silicon dioxide.

21. The attenuated phase shift mask of claim 12, wherein said first layer of attenuating material is selected from a group consisting of chromium oxynitride and chromium fluoride, said layer of etch stop material comprises silicon dioxide, and said second layer of attenuating material comprises molybdenum silicide oxynitride.

* * * * *

UNITED STATES PATENT AND TRADEMARK OFFICE
CERTIFICATE OF CORRECTION

PATENT NO. : 6,599,666 B2
DATED : July 29, 2003
INVENTOR(S) : J. Brett Rolfson

It is certified that error appears in the above-identified patent and that said Letters Patent is hereby corrected as shown below:

Drawings,
Figure 14, change "10" to -- 106 -- as shown below:

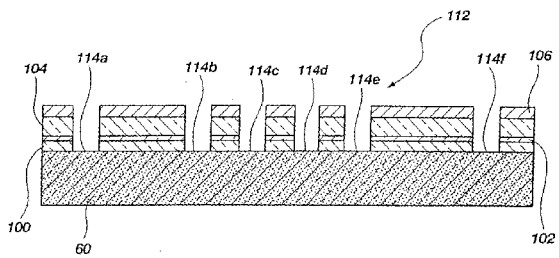

Fig. 14

Column 1,
Line 65, before "Importantly" delete "A"

Column 2,
Line 63, before "0.5" insert -- $\leq$ --

Column 3,
Line 5, before "APSM" delete "A"

Column 8,
Line 17, change "1800" to -- 180º --

Column 9,
Line 24, change "(SiO2)" to -- $(SiO_2)$ --
Line 38, change "100 layer" to -- layer 100 --
Line 54, before "the" delete "a"

Column 10,
Line 7, before "layer" delete "A"

UNITED STATES PATENT AND TRADEMARK OFFICE
CERTIFICATE OF CORRECTION

PATENT NO. : 6,599,666 B2
DATED : July 29, 2003
INVENTOR(S) : J. Brett Rolfson

It is certified that error appears in the above-identified patent and that said Letters Patent is hereby corrected as shown below:

Column 12,
Line 8, after "layer" and before "of" insert -- over said second layer --

Signed and Sealed this

Sixteenth Day of March, 2004

JON W. DUDAS
*Acting Director of the United States Patent and Trademark Office*